(12) United States Patent
Xiao et al.

(10) Patent No.: US 11,921,387 B2
(45) Date of Patent: Mar. 5, 2024

(54) DISPLAY PANEL HAVING FIRST SCAN LINES AND SECOND SCAN LINES CONNECTED IN PARALLEL AND DISPLAY DEVICE

(71) Applicant: SHENZHEN CHINA STAR OPTOELECTRONICS SEMICONDUCTOR DISPLAY TECHNOLOGY CO., LTD., Guangdong (CN)

(72) Inventors: Bangqing Xiao, Guangdong (CN); Sen Xu, Guangdong (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 628 days.

(21) Appl. No.: 17/254,923

(22) PCT Filed: Nov. 5, 2020

(86) PCT No.: PCT/CN2020/126686
§ 371 (c)(1),
(2) Date: Dec. 22, 2020

(87) PCT Pub. No.: WO2022/048007
PCT Pub. Date: Mar. 10, 2022

(65) Prior Publication Data
US 2022/0317527 A1 Oct. 6, 2022

(30) Foreign Application Priority Data
Sep. 4, 2020 (CN) .......................... 202010920946.5

(51) Int. Cl.
*G02F 1/1362* (2006.01)
*G02F 1/1345* (2006.01)
*H01L 27/12* (2006.01)

(52) U.S. Cl.
CPC .... *G02F 1/136286* (2013.01); *G02F 1/13454* (2013.01); *H01L 27/124* (2013.01)

(58) Field of Classification Search
CPC ........... G02F 1/136286; G02F 1/13454; G02F 1/13452; G02F 1/13306; H01L 27/124; G09G 3/3674
See application file for complete search history.

(56) References Cited

U.S. PATENT DOCUMENTS

2008/0158127 A1 7/2008 Chang et al.
2019/0302555 A1 10/2019 Tang
2023/0110225 A1* 4/2023 Zhu ...................... H01L 27/124
257/72

FOREIGN PATENT DOCUMENTS

| CN | 105372894 | 3/2016 |
|---|---|---|
| CN | 107065269 | 8/2017 |
| CN | 107450770 | 12/2017 |

(Continued)

*Primary Examiner* — David D Davis

(57) ABSTRACT

The present invention provides a display panel and a display device using the display panel. By connecting a plurality of second scan lines in parallel, resistance between output terminals of chips on film (COF) and first scan lines are reduced, and differences between output resistances of the COF corresponding to different first scan lines are reduced, so differences between signals in different first scan lines are reduced, and uneven display problems in existing display panels are solved.

20 Claims, 3 Drawing Sheets

(56) References Cited

FOREIGN PATENT DOCUMENTS

| | | |
|---|---|---|
| CN | 107807756 | 3/2018 |
| CN | 108490708 | 9/2018 |
| CN | 111505875 | 8/2020 |
| JP | 2018-124322 | 8/2018 |
| KR | 10-2015-0080118 | 7/2015 |

\* cited by examiner

DISPLAY PANEL HAVING FIRST SCAN LINES AND SECOND SCAN LINES CONNECTED IN PARALLEL AND DISPLAY DEVICE

RELATED APPLICATIONS

This application is a National Phase of PCT Patent Application No. PCT/CN2020/126686 having International filing date of Nov. 5, 2020, which claims the benefit of priority of Chinese Patent Application No. 202010920946.5 filed on Sep. 4, 2020. The contents of the above applications are all incorporated by reference as if fully set forth herein in their entirety.

FIELD AND BACKGROUND OF THE INVENTION

The present invention relates to the field of display technology and in particular to a display panel and a display device using the display panel.

In recent years, in order to realize better visual effects, designs of liquid crystal displays have gradually developed in a direction of ultra-narrow bezels or no bezels. In order to realize narrow bezels of the liquid crystal display, as shown in FIG. 1, in the prior art, a driving signal of a scan line and a driving signal of a data line are usually designed in a same side of a chip on film (COF). The driving signal of the scan line enters the display panel from the COF through a vertical wiring of the scan line, and is connected to a horizontal scan line through a via hole.

However, connection positions between horizontal scan lines and vertical scan lines are different, and resistances from output terminals of the COF to the connection positions are also different. The closer a connection points of a horizontal scan line and a vertical scan line are to the COF, the smaller the resistance from the COF to the connection positions; on the contrary, the farther the connection points of the horizontal scan line and the vertical scan line are from the COF, the greater the resistance from the COF to the connection positions. Different rows of horizontal scan lines have different resistances to the COF, which will cause differences between pixel signals of different rows. As a result, the display of the panel is uneven, which affects the display effect.

SUMMARY OF THE INVENTION

The objective of the present invention is to provide a display panel and a display device using the display panel to overcome a problem of uneven display in the existing display panel.

To solve the above-mentioned technical problem, the technical solutions provided by the present invention are as follows.

In a first aspect, an implementation provides a display panel that comprises a plurality of chips on film (COFs), a plurality of first scan lines, and a plurality of second scan lines.

Each of the plurality of COFs provides scan signals through the plurality of second scan lines, and one end of each of the plurality of second scan lines is connected to a signal output terminal of the plurality of COFs.

The plurality of first scan lines extend in a first direction and are disposed in parallel to each other, the plurality of second scan lines extend in a second direction and are disposed in parallel to each other, the first direction intersects the second direction, and a common hole is defined at a junction of each first scan line and each second scan line to form a via hole.

The via hole on each of the plurality of second scan lines divides the second scan line into a transmission section and a remaining section, and the remaining section of each second scan line in the plurality of second scan lines is connected in parallel.

A resistance between the signal output terminal and the via hole is adjustable.

In some implementations, at least one of the plurality of second scan lines is connected to a resistance compensation branch, and the resistance compensation branch is arranged between the signal output terminal and the via hole.

In some implementations, each of the plurality of COFs comprises a plurality of signal output terminals, and the plurality of signal output terminals are connected to one end of each of the plurality of second scan lines in one-to-one correspondence.

The transmission section is a portion from the signal output terminal to the via hole, the transmission section of at least one of the plurality of second scan lines is connected in parallel with the remaining section of another second scan line to form a parallel loop, and the resistance compensation branch is a portion of the remaining section in the parallel loop.

In some implementations, a length of the remaining section of one of two second scan lines connected in parallel is longer than a length of the remaining section of the other second scan line.

In some implementations, among the plurality of second scan lines, two second scan lines are connected in parallel through two bridge lines, the bridge lines extend along the first direction, and the bridge lines and the plurality of second scan lines are disposed on different layers of the display panel.

In some implementations, the plurality of second scan lines corresponding to a same COF of the plurality of COFs are connected in parallel.

In some implementations, a number of second scan lines corresponding to each of the plurality of COFs is N, where N is a positive integer.

The transmission section of a 1st second scan line is the shortest, and the transmission section of the N-th second scan line is the longest. The remaining section of the 1st second scan line is connected in parallel with the transmission section of the (N−1)-th second scan line, and the remaining section of the 2nd second scan line is connected in parallel with the transmission section of the N-th second scan line.

When N is an even number, the N/2-th second scan line is connected in parallel with the (N/2+1)-th second scan line. When N is an odd number, the (N−1)/2-th second scan line is connected in parallel with the ((N−1)/2+2)-th second scan line.

In some implementations, a number of second scan lines corresponding to each of the plurality of COFs is N, where N is a positive integer.

The transmission section of a 1st second scan line is the shortest, and the transmission section of the N-th second scan line is the longest. The remaining section of the 1st second scan line is connected in parallel with the transmission section of the N-th second scan line, and the remaining section of the 2nd second scan line is connected in parallel with the transmission section of the (N−1)-th second scan line.

When N is an even number, the N/2-th second scan line is connected in parallel with the (N/2+1)-th second scan line. When N is an odd number, the (N−1)/2-th second scan line is connected in parallel with the ((N−1)/2+2)-th second scan line.

In some implementations, the plurality of second scan lines corresponding to a different COF of the plurality of COFs are connected in parallel.

In some implementations, the M-th COF is adjacent to the (M+1)-th COF, the M-th COF corresponds to an N number of second scan lines, and the (M+1)-th COF corresponds to an N number of second scan lines, where M and N are positive integers.

The (N−2)-th second scan line corresponding to the M-th COF is connected in parallel with the 2nd second scan line corresponding to the (M+1)-th COF, the (N−1)-th second scan line corresponding to the M-th COF is connected in parallel with the 1st second scan line corresponding to the (M+1)-th COF, and the N-th second scan line corresponding to the M-th COF is connected in parallel with the 3rd second scan line corresponding to the (M+1)-th COF.

In some implementations, the M-th COF is adjacent to the (M+1)-th COF, the M-th COF corresponds to an N number of second scan lines, and the (M+1)-th COF corresponds to an N number of second scan lines, where M and N are positive integers.

The (N−2)-th second scan line corresponding to the M-th COF is connected in parallel with the 3rd second scan line corresponding to the (M+1)-th COF, the (N−1)-th second scan line corresponding to the M-th COF is connected in parallel with the 1st second scan line corresponding to the (M+1)-th COF, and the N-th second scan line corresponding to the M-th COF is connected in parallel with the 2nd second scan line corresponding to the (M+1)-th COF.

In some implementations, the M-th COF is adjacent to the (M+1)-th COF, the M-th COF corresponds to an N number of second scan lines, and the (M+1)-th COF corresponds to an N number of second scan lines, where M and N are positive integers.

The (N−2)-th second scan line corresponding to the M-th COF is connected in parallel with the 1st second scan line corresponding to the (M+1)-th COF, the (N−1)-th second scan line corresponding to the M-th COF is connected in parallel with the 2nd second scan line corresponding to the (M+1)-th COF, and the N-th second scan line corresponding to the M-th COF is connected in parallel with the 3rd second scan line corresponding to the (M+1)-th COF.

In some implementations, other ends of the second scan lines are connected in parallel and connected to an anti-interference signal.

In some implementations, other ends of the plurality of second scan lines are connected in parallel and connected to a common electrode signal line of the display panel.

In another aspect, an implementation of the present invention provides a display device comprising a display panel, the display panel comprises a plurality of chips on film (COFs), a plurality of first scan lines, and a plurality of second scan lines.

Each of the plurality of COFs provides scan signals through the plurality of second scan lines, and one end of each of the plurality of second scan lines is connected to a signal output terminal of the plurality of COFs.

The plurality of first scan lines extend in a first direction and are disposed in parallel to each other, the plurality of second scan lines extend in a second direction and are disposed in parallel to each other, the first direction intersects the second direction, and a common hole is defined at a junction of each first scan line and each second scan line to form a via hole.

The via hole on each of the plurality of second scan lines divides the second scan line into a transmission section and a remaining section, and the remaining section of each second scan line in the plurality of second scan lines is connected in parallel.

A resistance between the signal output terminal and the via hole is adjustable.

In some implementations, at least one of the plurality of second scan lines is connected to a resistance compensation branch, and the resistance compensation branch is arranged between the signal output terminal and the via hole.

In some implementations, each of the plurality of COFs comprises a plurality of signal output terminals, and the plurality of signal output terminals are connected to one end of each of the plurality of second scan lines in one-to-one correspondence.

The transmission section is a portion from the signal output terminal to the via hole, the transmission section of at least one of the plurality of second scan lines is connected in parallel with the remaining section of another second scan line to form a parallel loop, and the resistance compensation branch is a portion of the remaining section in the parallel loop.

In some implementations, a length of the remaining section of one of two second scan lines connected in parallel is longer than a length of the remaining section of the other second scan line.

In some implementations, among the plurality of second scan lines, two second scan lines are connected in parallel through two bridge lines, the bridge lines extend along the first direction, and the bridge lines and the plurality of second scan lines are disposed on different layers of the display panel.

In some implementations, the plurality of second scan lines corresponding to a same COF of the plurality of COFs are connected in parallel.

The present invention provides a display panel and a display device using the display panel. By connecting a plurality of second scan lines in parallel, resistances between output terminals of the COF and first scan lines are reduced, and differences between output resistances of the COF corresponding to different first scan lines are reduced, so that differences of signals in different first scan lines are reduced, and the problem of uneven display in the existing display panel is solved.

BRIEF DESCRIPTION OF THE SEVERAL VIEWS OF THE DRAWINGS

The technical solutions, as well as other beneficial advantages, of the present invention will be apparent from the following detailed descriptions of embodiments of the present invention, with reference to the attached drawings.

DESCRIPTION OF SPECIFIC EMBODIMENTS OF THE INVENTION

Figure 1:
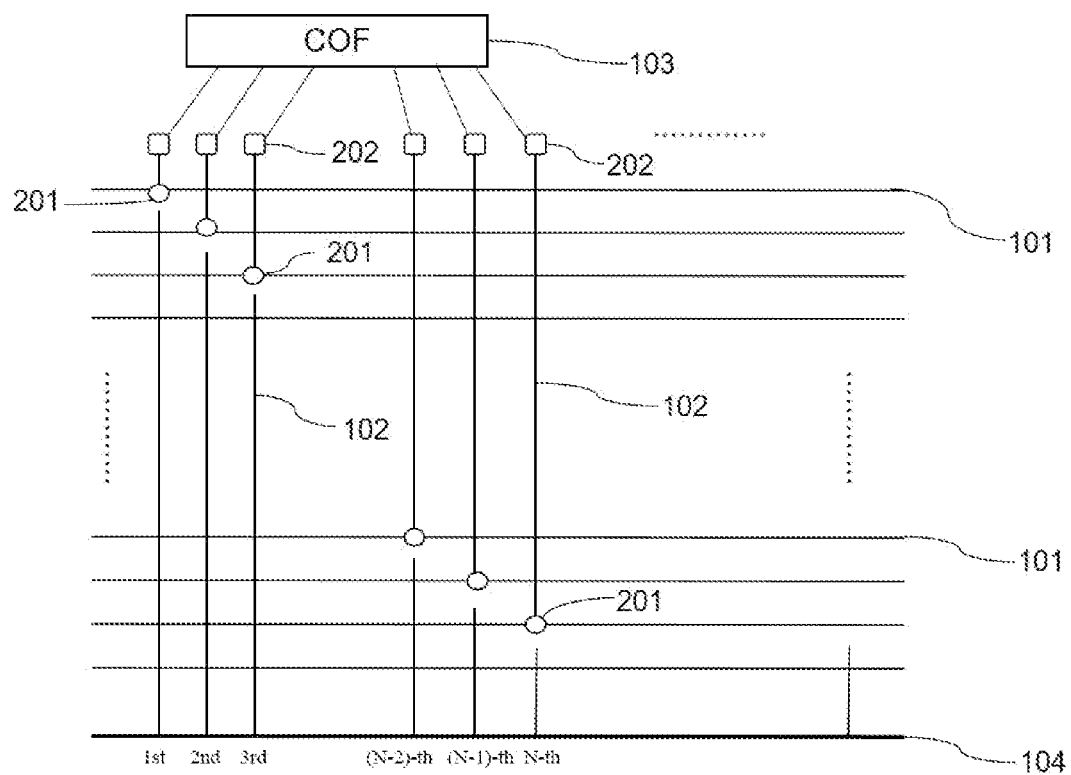
FIG. 1 is a schematic structural view of a display panel in the prior art.

The technical solutions in the embodiments of the present invention will be described clearly and completely hereinafter with reference to the accompanying drawings. It is apparent that the described embodiments are only a part of embodiments of the present invention, not all the embodiments. All other embodiments obtained by those skilled in the art based on the embodiments of the present invention belong to the protecting scope of the present invention.

In description of the present invention, it should be understood that orientational or positional relationships represented by directional terms mentioned in the present invention, such as central, longitudinal, lateral, length, width, thickness, up, down, front, rear, left, right, vertical, horizontal, top, bottom, inside, outside, clockwise, anti-clockwise, etc., are orientational or positional relationships based on the drawings, and are merely for the convenience of describing the present invention and simplifying the description, rather than indicating or implying that the device or element is intended to have a particular orientation, or is constructed and operated in a particular orientation, and therefore, should not be interpreted as a limitation of the present invention. In addition, terms such as "first" and "second" are used herein for purposes of description, and should not be interpreted as indication or implication of relative importance, or implied indication of a number of the technical features. Therefore, features limited by terms such as "first" and "second" can explicitly or impliedly include one or more than one of these features. In description of the present invention, "a plurality of" means two or more than two, unless otherwise specified.

In the present invention, it is stated that, unless specified or limited otherwise, the terms "mounted," "connected," "coupled," "fixed" and the like are interpreted broadly, and may be, for example, fixed connections, detachable connections, or integral connections; may also be mechanical or electrical connections; may also be direct connections or indirect connections via intervening structures; may also be inner communications of two elements. For those skilled in the art, the specific meanings of the above-mentioned terms in the present invention can be understood according to specific situations.

In the present invention, unless specified or limited otherwise, a first feature is "on" or "below" a second feature may include an embodiment in which the first feature is in direct contact with the second feature, and may also include an embodiment in which the first feature and the second feature are not in direct contact with each other, but are contacted via an additional feature formed therebetween. Furthermore, a first feature "on," "above," or "on top of" a second feature may include an embodiment in which the first feature is right or obliquely "on," "above," or "on top of" the second feature, or just means that the first feature is at a height higher than that of the second feature. A first feature "below," "under," or "on bottom of" a second feature may include an embodiment in which the first feature is right or obliquely "below," "under," or "on bottom of" the second feature, or just means that the first feature is at a height lower than that of the second feature.

Various embodiments and examples are provided in the following description to implement different structures of the present invention. In order to simplify the present invention, certain elements and settings will be described hereinafter. However, these elements and settings are only by way of example and are not intended to limit the present invention. In addition, reference numerals may be repeated in different examples in the present invention. This repeating is for the purpose of simplification and clarity and does not refer to relations between different embodiments and/or settings. Furthermore, examples of different processes and materials are provided in the present invention. However, it would be appreciated by those skilled in the art that other processes and/or materials may be also applied.

The present invention provides a display panel and a display device using the display panel, which will be described in detail below.

Figure 2:
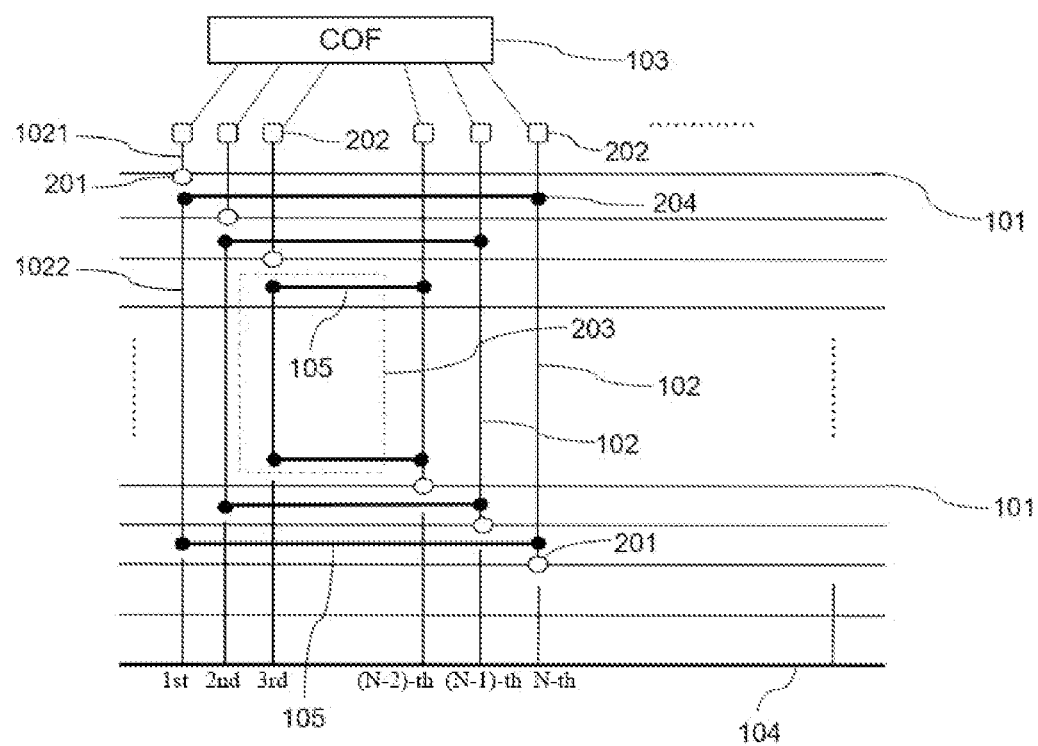
FIG. 2 is a schematic structural view of a display panel in accordance with an embodiment of the present invention.

First, an embodiment of the present invention provides a display panel. As shown in FIG. 2, the display panel comprises a plurality of chip on films (COFs) 103, a plurality of first scan lines 101, and a plurality of second scan lines 102. The plurality of first scan lines 101 extend in a first direction and are disposed in parallel to each other, and the plurality of second scan lines 102 extend in a second direction and are disposed in parallel to each other. The first direction intersects the second direction, and the plurality of first scan lines 101 and the plurality of second scan lines 102 intersect each other. In this embodiment of the present invention, the first direction is a horizontal direction, and the second direction is a vertical direction.

Each of the plurality of first scan lines 101 and each of the plurality of second scan lines 102 are in one-to-one correspondence, and the first scan lines 101 and the second scan lines 102 are disposed on different layers of the substrate in the display panel. A common hole is defined at a junction of each first scan line 101 and each second scan line 102 to form a via hole 201. One end of each second scan line 102 is connected to an output terminal 202 of each COF 103, and each of the COF transmits a scan driving signal to the first scan line 101 through the second scan line 102. Thin film transistors (TFTs) in each row share one first scan line 101. The first scan line 101 and the second scan line 102 are connected at the via hole 201, so as to provide a gate signal to the TFTs of each row.

The second scan lines 102 extend along the second direction. In order to ensure that a metal deposition of the display panel is uniform, after a second scan line 102 is connected to a first scan line 101 at the via hole 201, there is still extra wiring in the second direction, the extra wiring intersects the first scan line, and there will be parasitic capacitance between the scan lines, causing interference. In order to prevent signal interference, the other end of the second scan line 102 needs to be connected in parallel and connected to a signal. As shown in FIG. 2, in this embodiment of the present invention, the other end of the second scan line 102 is connected to a common electrode signal line 104 of the display panel.

Since connection positions of the via hole 201 of the first scan lines 101 and the second scan lines 102 are different, for the first scan lines 101 of different rows, a wiring length of the second scan line 102 from the output terminal 202 of the COF 103 to the via hole 201 is also different. The farther the output terminal 202 of the COF 103 is from the via hole 201, the longer the wiring length of the second scan line 102, and the greater the resistance from the output terminal of the COF 103 to the via hole 201. This resistance is a COF output resistance corresponding to each first scan line 101. Since the COF output resistances of different first scan lines 101 are different, the signals transmitted from the COF 103 to the different first scan lines 101 will also be different, thereby causing uneven display.

In this embodiment of the present invention, resistance between the output terminal 202 of the COF 103 and the via hole 201 is adjustable. In some embodiments, as shown in FIG. 2, at least one of the plurality of second scan lines 102 is connected to a resistance compensation branch 203, and the resistance compensation branch 203 is arranged between the output terminal 202 of the COF 103 and the via hole 201.

The resistance compensation branch 203 can reduce a magnitude of the COF output resistance of the first scan line 101, so that differences between the COF output resistance of different first scan lines 101 are reduced, thereby reducing differences between signals in different first scan lines 101.

In this embodiment of the present invention, as shown in FIG. 2, each of the plurality of COFs 103 comprises a plurality of signal output terminals 202, and the plurality of signal output terminals 202 are connected to the plurality of second scan lines 102 in one-to-one correspondence. The via hole 201 on each second scan line 102 divides the second scan line 102 into a transmission section 1021 and a remaining section 1022. The transmission section 1021 is from the output terminal 202 to the via hole 201, and the transmission section 1021 and the remaining section 1022 are disconnected. As shown in FIG. 2, the transmission section 1021 of at least one second scan line 102 is connected in parallel with the remaining section 1022 of another second scan line 102 to form a parallel loop, and a portion of the remaining section 1022 in the parallel loop is the resistance compensation branch 203. By connecting the transmission section 1021 of one second scan line 102 in parallel with the remaining section 1022 of another second scan line 102, resistance from the signal output terminal 202 of the COF 103 to the first scan line 101 is reduced.

It can be understood that, the transmission section 1021 of one second scan line 102 can also be connected in parallel with another wire instead of the remaining sections 1022 of another second scan line 102, which can also reduce the COF output resistance. However, if additional wires are connected in parallel, a number of wires in the display panel will increase and the cost will be increased. By connecting the plurality of second scan lines 102 in parallel, the transmission section 1021 and the remaining section 1022 of the existing second scan line are connected in parallel. After the parallel connection, a portion of the remaining section 1022 forms the resistance compensation branch 203, which avoids an increase in cost and simplifies a structure of the display panel.

In order to reduce the resistance between the signal output terminal 202 and the via hole 201 as much as possible, in this embodiment of the present invention, as shown in FIG. 2, a length of the remaining section 1022 of one of two second scan lines connected in parallel is longer than a length of the remaining section 1022 of the other second scan line. On each second scan line 102, the shorter the transmission section 1021, the longer the remaining section 1022. The longer the remaining section 1022 is, the better the effect of reducing the resistance after being connected in parallel with another second scan line 102.

Different second scan lines 102 need to be connected in parallel through wires. A direction of the parallel wires does not have much impact on the reduction of COF output resistance. However, if the parallel wires between different second scan lines 101 intersects the first scan lines 101, and the position of the parallel wire at the intersection will cause interference to the signal in the first scan line 101. In this embodiment of the present invention, as shown in FIG. 2, among the plurality of second scan lines 102, every two second scan lines 102 are connected in parallel through two bridge lines 105, the bridge lines 105 extend along the first direction, and in parallel with the plurality of first scan lines 101, so as to avoid signal interference caused by intersecting the first scan lines 101. The bridge lines 105 and the plurality of second scan lines 102 are disposed on different layers of the display panel, and a common hole is opened at a junction of the bridge line 105 and the second scan line 102 to form a bridge via hole 204 for connection.

In order to minimize the difference of COF output resistance between different first scan lines 101, in some embodiments of the present invention, as shown in FIG. 2, the plurality of second scan lines 102 corresponding to each of the plurality of COF 103 are connected in parallel. A number of second scan lines 102 corresponding to each COF 103 is N, where N is a positive integer. The transmission section 1021 of a 1st second scan line 102 is the shortest, the transmission section 1021 of the N-th second scan line 102 is the longest, the remaining section 1022 of the 1st second scan line 102 is connected in parallel with the transmission section 1021 of the N-th second scan line 102, and the remaining section 1022 of the 2nd second scan line 102 is connected in parallel with the transmission section 1021 of the (N−1)-th second scan line 102. As such, the plurality of second scan lines 102 corresponding to each COF are connected in parallel in a one-to-one correspondence.

It should be noted that, when N is an even number, the 1st second scan line is connected in parallel with the N-th second scan line, and the 2nd second scan line 102 is connected in parallel with the (N−1)-th second scan line. As such, the N/2-th second scan line is connected in parallel with the (N/2+1)-th second scan line; and when N is an odd number, the 1st second scan line is connected in parallel with the N-th second scan line, and the 2nd second scan line is connected in parallel with the (N−1)-th second scan line. As such, the (N−1)/2-th second scan line is connected in parallel with the ((N−1)/2+2)-th second scan line.

By connecting the second scan line 102 with the shortest transmission section 1021 and the second scan line 102 with the longest transmission section 1021 in parallel, and connecting the scan line 102 with the second shortest transmission section 1021 and the scan line 102 with the second longest transmission section 1021 in parallel, and so on, the plurality of second scan lines 102 corresponding to each COF are connected in parallel in a one-to-one correspondence, which can minimize the difference between the COF output resistances of different first scan lines 101.

It should be noted that correspondence between the plurality of second scan lines 102 can be adjusted according to actual conditions. For example, the 1st second scan line can be connected in parallel with the (N−1)-th second scan line, or it can be connected with the (N−2)-th second scan line, and there is no limitation herein.

When the plurality of second scan lines 102 corresponding to a same COF 103 are connected in parallel, and the number of second scan lines 102 is N, because a distance between the 1st second scan line 102 and the N-th second scan line 102 is long, this results in a greater length of the bridge line 105 between the two second scan lines 102, which increases the manufacturing cost of the display panel.

Figure 3:
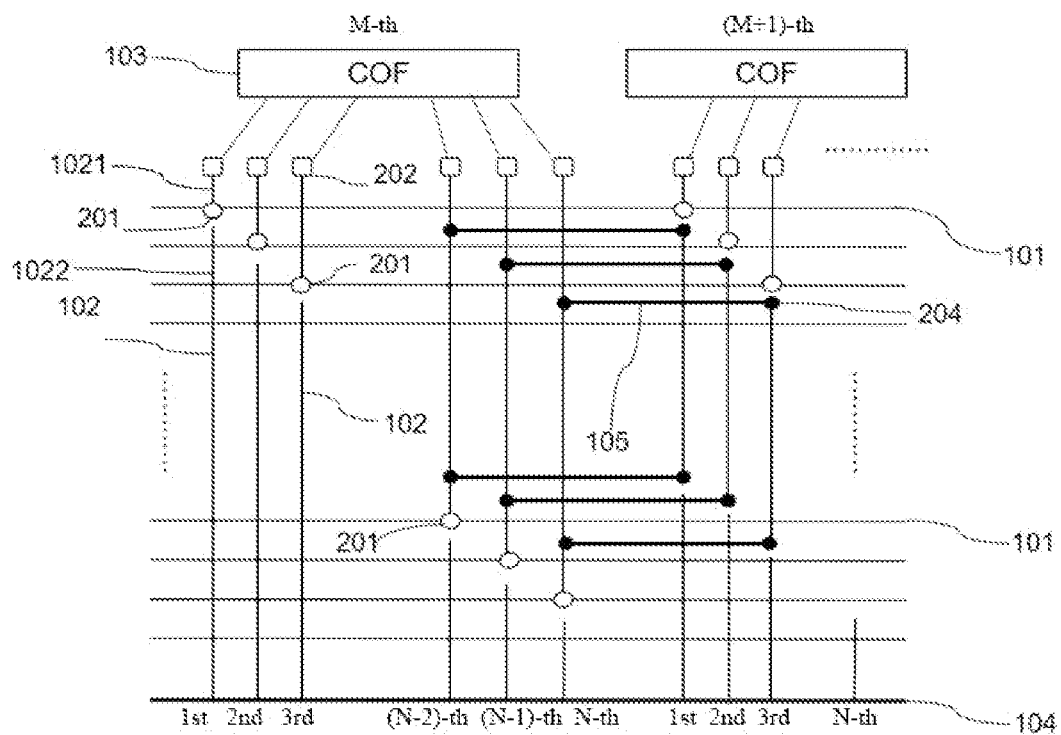
FIG. 3 is a schematic structural view of the display panel in accordance with another embodiment of the present invention.

In order to reduce the length of the bridge line 105 and reduce the manufacturing cost, in some embodiments of the present invention, the plurality of second scan lines 102 corresponding to different COFs 103 are connected in parallel. As shown in FIG. 3, the M-th COF 103 is adjacent to the (M+1)-th COF 103, and each COF 103 is correspondingly connected to an N number of second scan lines 102, wherein M and N are positive integers.

In each COF 103, the transmission section 1021 of a 1st second scan line 102 is the shortest, and the transmission section 1021 of the N-th second scan line 102 is the longest. The (N−2)-th second scan line 102 corresponding to the M-th COF 103 is connected in parallel with the 1st second scan line 102 corresponding to the (M+1)-th COF 103, the (N−1)-th second scan line 102 corresponding to the M-th COF 103 is connected in parallel with the 2nd second scan line 102 corresponding to the (M+1)-th COF 103, and the N-th second scan line 102 corresponding to the M-th COF 103 is connected in parallel with the 3rd second scan line 102 corresponding to the (M+1)-th COF 103. As such, the plurality of second scan lines 102 corresponding to the M-th COF 103 and the plurality of second scan lines 102 corresponding to the (M+1)-th COF 103 are connected in parallel in a one-to-one correspondence.

Since the N-th second scan line 102 of the M-th COF 103 is closer to the 3rd second scan line 102 of the (M+1)-th COF 103, the N-th second scan line 102 of the M-th COF 103 is far from the 1st scan line. Compared with connecting the plurality of second scan lines 102 of the same COF 103 in parallel, by connecting the plurality of second scan lines 102 corresponding to different COF 103 in parallel, it is possible to reduce the COF output resistance of the first scan lines 101 while reducing a length of the bridge line 105, thereby reducing the manufacturing cost of the display panel.

It should be noted that, the correspondence between the plurality of second scan lines 102 can be adjusted according to actual conditions. For example, the (N−2)-th second scan line 102 corresponding to the M-th COF 103 may connected in parallel with the 1st second scan line 102 corresponding to the (M+1)-th COF 103, and may also be connected in parallel with the 2nd or 3rd second scan line 102 corresponding to the (M+1)-th COF 103, and there is no limitation herein.

In order to avoid signal delay and ensure the display effect, the plurality of first scan lines 101 and the plurality of second scan lines 102 in the display panel need to be made of materials with good conductivity. The material of the scan lines in the embodiments of the present invention is copper or aluminum. If cost permits, the material of the scan lines can also be other metals with good conductivity.

In order to maintain a brightness of the display panel after the TFT is turned off, an electric field needs to be added to maintain a deflection angle of the liquid crystal. A common electrode signal line 104 is disposed in the display panel to achieve this function. After the second scan line 102 is connected to the first scan line 101 at the via hole 201, there is still redundant wiring along the second direction, that is, the remaining section. The intersecting of the remaining section 1022 of the second scan line 102 with the first scan line will cause signal interference. To avoid signal interference, other ends of the plurality of second scan lines 102 need to be connected in parallel and connected to a signal.

In some embodiments of the present invention, the signals connected to the ends of the plurality of second scan lines are the same as the common electrode signal, i.e., other ends of the plurality of second scan lines 102 are connected in parallel and connected to the common electrode signal line 104 of the display panel. This can reduce the number of signal lines and reduce costs. It should be noted that, the signal connected to other ends of the plurality of second scan lines 102 may also be different from the common electrode signal, i.e., another signal line is added to the display panel. After other ends of the plurality of second scan lines 102 are connected in parallel, they are connected to the added signal line, and there is no limitation herein.

This embodiment of the present invention further provides a display panel, comprising the display panel provided in the above-mentioned embodiments.

The embodiments of the present invention further provide a display device, comprising the display panel provided in the above-mentioned embodiments. The display device may be a display screen of a mobile phone, a computer, a TV, etc., which is not limited herein.

The embodiments of present invention provide a display panel and a display device using the display panel. By connecting a plurality of second scan lines in parallel, resistance between output terminals of the COF and first scan lines is reduced, and differences between output resistances of the COF corresponding to different first scan lines are reduced, so that differences of signals in different first scan lines are reduced, and a problem of uneven display in the existing display panel is solved.

The above describes in detail a display panel and a display device provided by the present invention. Specific examples are used herein to illustrate the principles and implementations of the present invention. The description of the above embodiments is only used to help understanding the technical solutions of the present invention and its core concept. Those skilled in the art should understand that they may still make modifications to the technical solutions described in the foregoing embodiments or make equivalent replacements to some or all technical features thereof, without departing from the scope of the technical solutions of the embodiments of the present invention.

What is claimed is:

1. A display panel, comprising a plurality of chips on film (COFs), a plurality of first scan lines and a plurality of second scan lines;
   wherein each of the plurality of COFs provides scan signals through the plurality of second scan lines, and one end of each of the plurality of second scan lines is connected to a signal output terminal of the plurality of COFs;
   wherein the plurality of first scan lines extend in a first direction and are disposed in parallel to each other, the plurality of second scan lines extend in a second direction and are disposed in parallel to each other, the first direction intersects the second direction, and a common hole is defined at a junction of each first scan line and each second scan line to form a via hole;
   wherein the via hole on each of the plurality of second scan lines divides the second scan line into a transmission section and a remaining section, and the remaining section of each second scan line in the plurality of second scan lines is connected in parallel; and
   wherein resistance between the signal output terminal and the via hole is adjustable.

2. The display panel as claimed in claim 1, wherein at least one of the plurality of second scan lines is connected to a resistance compensation branch, and the resistance compensation branch is arranged between the signal output terminal and the via hole.

3. The display panel as claimed in claim 2, wherein each of the plurality of COFs comprises a plurality of signal output terminals, and the plurality of signal output terminals are connected to one end of each of the plurality of second scan lines in one-to-one correspondence; and
   the transmission section is a portion from the signal output terminal to the via hole, the transmission section of at least one of the plurality of second scan lines is connected in parallel with the remaining section of another second scan line to form a parallel loop, and the resistance compensation branch is a portion of the remaining section in the parallel loop.

4. The display panel as claimed in claim 3, wherein a length of the remaining section of one of two second scan lines connected in parallel is longer than a length of the remaining section of the other second scan line.

5. The display panel as claimed in claim 4, wherein among the plurality of second scan lines, two second scan lines are connected in parallel through two bridge lines, the bridge lines extend along the first direction, and the bridge lines and the plurality of second scan lines are disposed on different layers of the display panel.

6. The display panel as claimed in claim 5, wherein the plurality of second scan lines corresponding to a same COF of the plurality of COFs are connected in parallel.

7. The display panel as claimed in claim 6, wherein a number of second scan lines corresponding to each of the plurality of COFs is N, where N is a positive integer; and
the transmission section of a 1st second scan line is the shortest, the transmission section of the N-th second scan line is the longest, the remaining section of the 1st second scan line is connected in parallel with the transmission section of the (N−1)-th second scan line, and the remaining section of the 2nd second scan line is connected in parallel with the transmission section of the N-th second scan line; and
when N is an even number, the N/2-th second scan line is connected in parallel with the (N/2+1)-th second scan line, and when N is an odd number, the (N−1)/2-th second scan line is connected in parallel with the ((N−1)/2+2)-th second scan line.

8. The display panel as claimed in claim 6, wherein a number of second scan lines corresponding to each of the plurality of COFs is N, where N is a positive integer; and
the transmission section of a 1st second scan line is the shortest, the transmission section of the N-th second scan line is the longest, the remaining section of the 1st second scan line is connected in parallel with the transmission section of the N-th second scan line, and the remaining section of the 2nd second scan line is connected in parallel with the transmission section of the (N−1)-th second scan line; and
when N is an even number, the N/2-th second scan line is connected in parallel with the (N/2+1)-th second scan line, and when N is an odd number, the (N−1)/2-th second scan line is connected in parallel with the ((N−1)/2+2)-th second scan line.

9. The display panel as claimed in claim 5, wherein the plurality of second scan lines corresponding to a different COF of the plurality of COFs are connected in parallel.

10. The display panel as claimed in claim 9, wherein the M-th COF is adjacent to the (M+1)-th COF, the M-th COF corresponds to an N number of second scan lines, and the (M+1)-th COF corresponds to an N number of second scan lines, where M and N are positive integers; and
the (N−2)-th second scan line corresponding to the M-th COF is connected in parallel with the 2nd second scan line corresponding to the (M+1)-th COF, the (N−1)-th second scan line corresponding to the M-th COF is connected in parallel with the 1st second scan line corresponding to the (M+1)-th COF, and the N-th second scan line corresponding to the M-th COF is connected in parallel with the 3rd second scan line corresponding to the (M+1)-th COF.

11. The display panel as claimed in claim 9, wherein the M-th COF is adjacent to the (M+1)-th COF, the M-th COF corresponds to an N number of second scan lines, and the (M+1)-th COF corresponds to an N number of second scan lines, wherein M and N are positive integers; and
the (N−2)-th second scan line corresponding to the M-th COF is connected in parallel with the 3rd second scan line corresponding to the (M+1)-th COF, the (N−1)-th second scan line corresponding to the M-th COF is connected in parallel with the 1st second scan line corresponding to the (M+1)-th COF, and the N-th second scan line corresponding to the M-th COF is connected in parallel with the 2nd second scan line corresponding to the (M+1)-th COF.

12. The display panel as claimed in claim 9, wherein the M-th COF is adjacent to the (M+1)-th COF, the M-th COF corresponds to an N number of second scan lines, and the (M+1)-th COF corresponds to an N number of second scan lines, wherein M and N are positive integers; and
the (N−2)-th second scan line corresponding to the M-th COF is connected in parallel with the 1st second scan line corresponding to the (M+1)-th COF, the (N−1)-th second scan line corresponding to the M-th COF is connected in parallel with the 2nd second scan line corresponding to the (M+1)-th COF, and the N-th second scan line corresponding to the M-th COF is connected in parallel with the 3rd second scan line corresponding to the (M+1)-th COF.

13. The display panel as claimed in claim 5, wherein other ends of the second scan lines are connected in parallel and connected to an anti-interference signal.

14. The display panel as claimed in claim 5, wherein other ends of the plurality of second scan lines are connected in parallel and connected to a common electrode signal line of the display panel.

15. A display device comprising a display panel, wherein the display panel comprises a plurality of chips on film (COFs), a plurality of first scan lines, and a plurality of second scan lines;
wherein each of the plurality of COFs provides scan signals through the plurality of second scan lines, and one end of each of the plurality of second scan lines is connected to a signal output terminal of the plurality of COFs;
wherein the plurality of first scan lines extend in a first direction and are disposed in parallel to each other, the plurality of second scan lines extend in a second direction and are disposed in parallel to each other, the first direction intersects the second direction, and a common hole is defined at a junction of each first scan line and each second scan line to form a via hole;
wherein the via hole on each of the plurality of second scan lines divides the second scan line into a transmission section and a remaining section, and the remaining section of each second scan line in the plurality of second scan lines is connected in parallel; and
wherein resistance between the signal output terminal and the via hole is adjustable.

16. The display device as claimed in claim 15, wherein at least one of the plurality of second scan lines is connected to a resistance compensation branch, and the resistance compensation branch is arranged between the signal output terminal and the via hole.

17. The display device as claimed in claim 16, wherein each of the plurality of COFs comprises a plurality of signal output terminals, and the plurality of signal output terminals are connected to one end of each of the plurality of second scan lines in one-to-one correspondence; and
the transmission section is a portion from the signal output terminal to the via hole, the transmission section of at least one of the plurality of second scan lines is connected in parallel with the remaining section of another second scan line to form a parallel loop, and the resistance compensation branch is a portion of the remaining section in the parallel loop.

18. The display device as claimed in claim 17, wherein a length of the remaining section of one of two second scan lines connected in parallel is longer than a length of the remaining section of the other second scan line.

19. The display device as claimed in claim 18, wherein among the plurality of second scan lines, two second scan lines are connected in parallel through two bridge lines, the bridge lines extend along the first direction, and the bridge lines and the plurality of second scan lines are disposed on different layers of the display panel.

20. The display device as claimed in claim 19, wherein the plurality of second scan lines corresponding to a same COF of the plurality of COFs are connected in parallel.

\* \* \* \* \*